United States Patent [19]

Zagloul et al.

[11] Patent Number: 5,369,670
[45] Date of Patent: Nov. 29, 1994

[54] METHOD AND APPARATUS FOR DEMODULATION OF A SIGNAL TRANSMITTED OVER A FADING CHANNEL USING PHASE ESTIMATION

[75] Inventors: Hatim Zagloul; Michel Fattouche, both of Alberta, Canada

[73] Assignee: AGT Limited, Canada

[21] Appl. No.: 837,198

[22] Filed: Feb. 14, 1992

[51] Int. Cl.$^5$ .................. H03D 3/02; H04L 27/22; G06F 15/332
[52] U.S. Cl. ........................ 375/84; 375/80; 375/94; 370/23; 382/43; 364/726
[58] Field of Search ............... 375/1, 39, 80, 83–86, 375/94, 96; 370/19–23; 371/43; 382/42–43; 364/725, 726

[56] References Cited

U.S. PATENT DOCUMENTS

| | | | |
|---|---|---|---|
| 3,510,640 | 5/1970 | Voelcker, Jr. | 235/197 |
| 4,601,005 | 7/1986 | Kilvington | 371/1 |
| 4,893,266 | 1/1990 | Deem | 364/726 |
| 5,034,911 | 7/1991 | Rachels | 364/726 |
| 5,089,982 | 2/1992 | Gran et al. | 364/726 |

OTHER PUBLICATIONS

"Estimation of Phase Differential of Signals Transmitted over Fading Channels", *Electronic Letters*, vol. 27, No. 20, pp. 1823–1824, Sep. 1991.

M. A. Poletti, et al., "Reduction of Multipath Fading Effects in Single Variable Modulations", *I.S.S.P.A.-90, Signal Processing Theories*, pp. 672–676, 27–31, Aug. 1990.

*Primary Examiner*—Stephen Chin
*Assistant Examiner*—Young Tse
*Attorney, Agent, or Firm*—Skjerven, Morrill, MacPherson, Franklin and Friel

[57] ABSTRACT

A method and apparatus for estimating the phase differential of a transmitted electromagnetic signal from the amplitude envelope of the signal. The apparatus includes a sampler, phase estimator and demodulator. The phase estimator uses a Hilbert transform or an approximation of the Hilbert transform to estimate the phase differential. The method may be applied to time domain or frequency domain signals. The phase differential is estimated by taking the differential of a function of the envelope, and applying the Hilbert transform to this differential. The resulting phase differential, after correction for sign ambiguity may be used to demodulate the received signal.

7 Claims, 6 Drawing Sheets

METHOD AND APPARATUS FOR DEMODULATION OF A SIGNAL TRANSMITTED OVER A FADING CHANNEL USING PHASE ESTIMATION

FIELD OF THE INVENTION

This invention relates to a method and apparatus for demodulating a signal transmitted over a fading channel using phase estimation where the phase estimation is derived from the amplitude of the signal.

CLAIM TO COPYRIGHT

A portion of the disclosure of this patent document contains material which is subject to copyright protection. The copyright owner has no objection to the facsimile reproduction by anyone of the patent document, as it appears in the Patent and Trademark Office patent file or records, but otherwise reserves all copyright rights whatsoever.

BACKGROUND AND SUMMARY OF THE INVENTION

In wireless communication networks in which a moving portable radio may be communicating with a fixed base station, the received signal may be severely degraded by the many paths the signal may take from the portable to the base station. The many paths may include reflections from hills, buildings and overhead wires. Because the signal takes many paths, different reflections will arrive at an antenna slightly separated in time, and the combination of the multiple signals at the antenna may result in the cancellation of the signal for a period of time. Such a loss of signal is called a fade. The length of the fade will depend on the frequency of the signal and the speed at which the portable is moving. The problem caused by this signal degradation is called the multi-path problem.

The solution of the multi-path problem has received a great deal of attention by researchers. In part this is because of the increasing use of cellular telephones, whose use suffers greatly from the multi-path problem. Signal degradation caused by multiple paths of the signal increases the probability of error in the reception of the signal by altering the phase of the received signal. This is important because the emerging standard for digital cellular communications in North America uses a phase modulation scheme, namely $\pi/4$ offset differential quadrature phase shift keying (DQPSK). See Cellular System, "Dual Mode mobile station-base compatibility standard." EIA/TIA, Project no. 2215, Electronic Industries Association, January 1990.

With mobile radio channels short term fading may result in fades or nulls about every one half wavelength of the wave in question ($\approx 0.175$ m for 850 MHz waves). If this pattern is assumed to be stationary, for simplicity, then an antenna mounted on a vehicle travelling at 27.7 m/s($\approx 100$ km/hr) will encounter a null about every 6.3 ms. With FM modulation, this leads to click noise at about 159 Hz. With DQPSK having 24.3 kSymbols/s, this noise may appear not to be long enough to introduce a symbol error. However, if the differential phase of the standing wave pattern is composed of long intervals of constant value (corresponding to intervals of constant amplitude) and short intervals of spikes (corresponding to nulls in the amplitude) say of 1% of the 6.3 ms, then the antenna will traverse a spike in 0.063 ms every 153.1 symbols, long enough to introduce a symbol error.

The multi-path problem has been approached in several ways. Several approaches have considered envelope modelling with little emphasis on phase modelling. Also, neural networks have been proposed as in Provence, U.S. Pat. No. 4,885,757 issued Dec. 5, 1989. Several researchers have done phase modelling of an rf channel, but have not looked at phase prediction using the amplitude. Also, phase estimators using open loops have been proposed, but these have focused on the Gaussian channel. Estimation and tracking of phase changes of a carrier signal has been carried out by the use of phase locked loops (PLLs). Phase locked loops may include a squaring amplifier, a feedback loop and a divide by two amplifier. In a phase locked loop a signal of the same frequency as the carrier is generated locally using a voltage controlled oscillator. The phase of the output of the VCO is made to track the phase of the received carrier through a feedback loop. In this manner, the phase of the incoming signal may be tracked.

However, phase locked loops are not of great use for example in the proposed North American digital cellular standard because they cannot track the incoming signal fast enough and because with information on the signal, the operation of the phase locked loop is disturbed. To operate a phase locked loop with information on the signal, the signal must be averaged or have the information filtered out first, thus adding to the complexity of the receiver.

Other techniques for phase tracking include sending a pilot tone which allows the receiver to synchronize its local oscillator to the carrier frequency. However, the use of pilot tones also adds to the complexity of the receiver because an additional signal must be sent, received and processed. It would be preferable to be able to extract phase information from the amplitude of the received signal itself.

However, it has previously been considered that a fading channel is not a minimum phase channel and that there was no relationship between the envelope and phase of radio signals transmitted over such channels.

However, the inventors have discovered that it is possible to relate the amplitude and characteristics of the phase of a radio signal transmitted over a fading channel, and that an estimation of the phase differential may be made from sampling the amplitude of the transmitted signal. The estimated phase differential may be used to modify or demodulate the received signal. The inventors have published their findings in "Estimation of Phase Differential of Signals Transmitted Over Fading Channels", Electronics Letters, Vol. 27, No. 20, 1823-1824, September, 1991.

The invention may be applied to a signal in which the information in the signal is carried in the time domain or in the frequency domain. In the case of the frequency domain, a frequency transform may be taken of the signal and the method applied to the amplitude values for the frequency transform. In either case, it is preferred that, firstly, a differential of a function of the amplitude determined to produce a data record, and then a transform of the differential is taken to produce a signal corresponding to the estimated phase differential of the data record. This produces an estimated phase differential with sign ambiguity which may then be resolved using known techniques and the received signal may then be modified using the estimated phase differential to produce a corrected signal.

Preferably, the differential may be computed by using the logarithm of the amplitude samples, and uses adjacent amplitude samples. The preferred transform is the Hilbert transform, and the phase estimation is computed in the case of the time domain from $$\Delta\phi(t) = H[\Delta ln(A(t))]$$

in which H denotes the Hilbert transform, $\Delta\phi(t)$ is the estimated phase differential, and $A(t)$ is the amplitude samples. In the case of the frequency domain, "t" in the above expression and other expressions used in this patent document is replaced by "f".

Alternatively, the phase estimation may be obtained by:
constructing data frames of a number of consecutive amplitude samples of the electromagnetic signal;
selecting segments of the data frames where the amplitude of the electromagnetic signal is at least a predetermined number of dB less than its mean;
for each segment, estimating the phase differential $\Delta\phi(t)$ from $$\Delta\phi(t) \approx -t_0/(t_0^2 + t'^2)$$

where $t' = t - t_{min}$, t is the time from the beginning of the segment, $t_{min}$ is the time in the segment when the absolute value of the signal reaches its minimum, and $t_0$ is the period of time from the instant the amplitude of the electromagnetic signal reaches its minimum during the segment until the amplitude reaches double its minimum during the segment.

For simplicity, the sign of the phase differential need only be determined for segments with phase differentials greater than a preselected threshold.

BRIEF DESCRIPTION OF THE DRAWINGS

There will now be described a preferred embodiment of the invention, with reference to the drawings, by way of illustration, in which like numerals denote like elements and in which:

FIG. 4b is a graph showing estimated and measured phase differentials for a signal transmitted over the indoor channel of FIG. 4a.

An appendix to this patent disclosure contains a computer program for simulating the equalizer.

DETAILED DESCRIPTION OF PREFERRED EMBODIMENTS

The signals to which the present invention may be applied are typically electromagnetic signals and this detailed description will assume that is the case, but the invention is believed to have utility for acoustic signals as well. A modulated signal is a carrier signal that has been modified by a signal that is a representation of some physical quantity (such as speech). A transmitted signal is a signal that has a remote source and that travels through a medium between the source and the receiver. A fade is a part of a signal over which the signal level is below about 15 dB of the running mean of the amplitude of the received signal. A differential of a sequence of symbols or data points is a measure of the time rate of change of a sequence of symbols or data points. For digital signals, which are of most interest here, the time interval between symbols may be assumed to be fixed so that while the differential is a measure of the rate of change, it may be estimated as a difference between symbols or data points. As applied in this disclosure, the preferred differential is the difference between adjacent (consecutive) symbols. A data record, or sequence of symbols, is composed of a finite set of data points or symbols. A channel is a band of frequencies in the electromagnetic spectrum that are used for the transmission of the electromagnetic signal.

Figure 1:
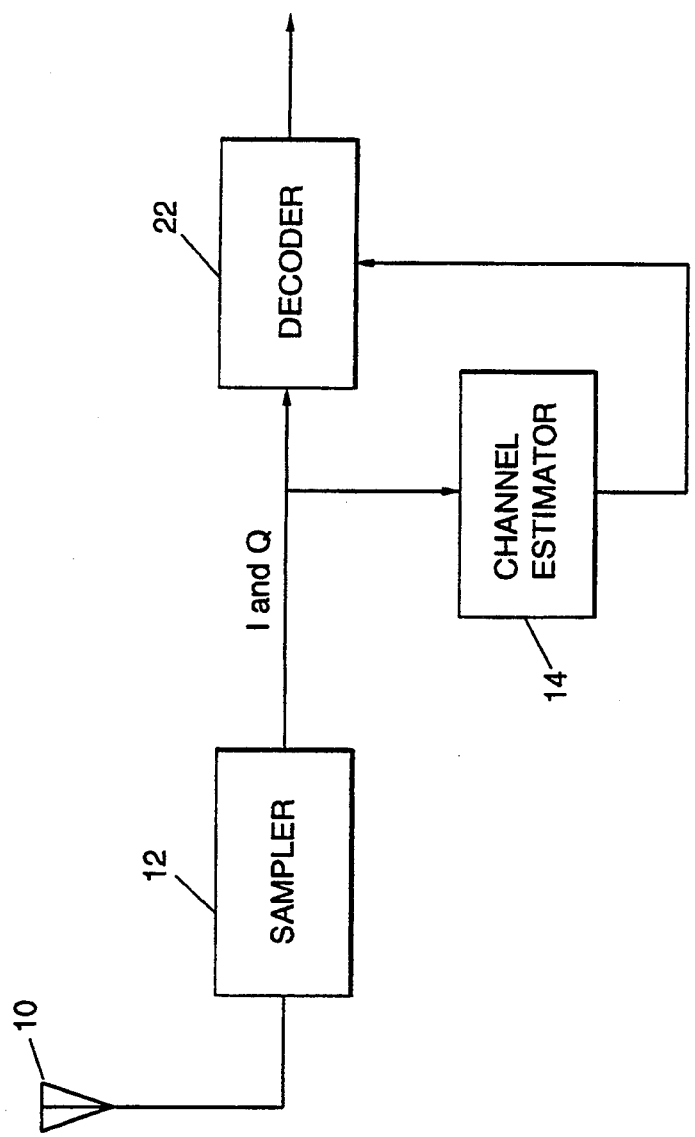
FIG. 1 is a block diagram showing an embodiment of an equalizer according to the invention.

Referring to FIG. 1, there is shown a block diagram of an apparatus according to the invention. An incoming transmitted electromagnetic carrier signal is received at an antenna 10 and passed to sampler 12 having output corresponding to an amplitude characteristic of the signal. Samplers (for example, analog to digital converters) and antennas are well known in the art and need not be described here. Sampler 12 samples finite segments of the carrier signal at above the Nyquist rate and produces a finite set of K digital samples. The information in the carrier signal may be carried in the phase differential of a number of consecutive time instants, or as differential phase shifts of a number of frequency components of the transmitted signal. The sampler measures both the inphase (I) and quadrature (Q) components of the envelope of the received signal. The samples I and Q are sent to the channel estimator 14 where phase estimation according to the invention is carried out.

Figure 2:
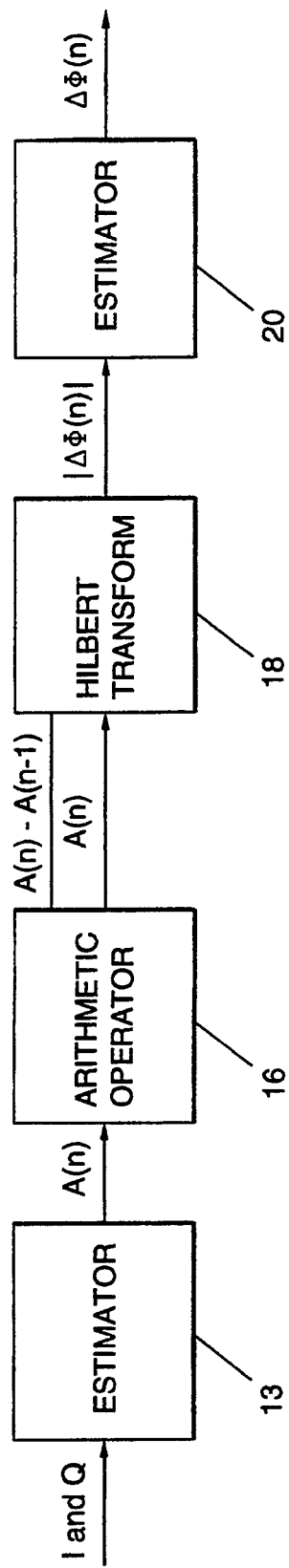
FIG. 2 is a block diagram of a phase estimator for use in the equalizer of FIG. 1.
Figure 3:
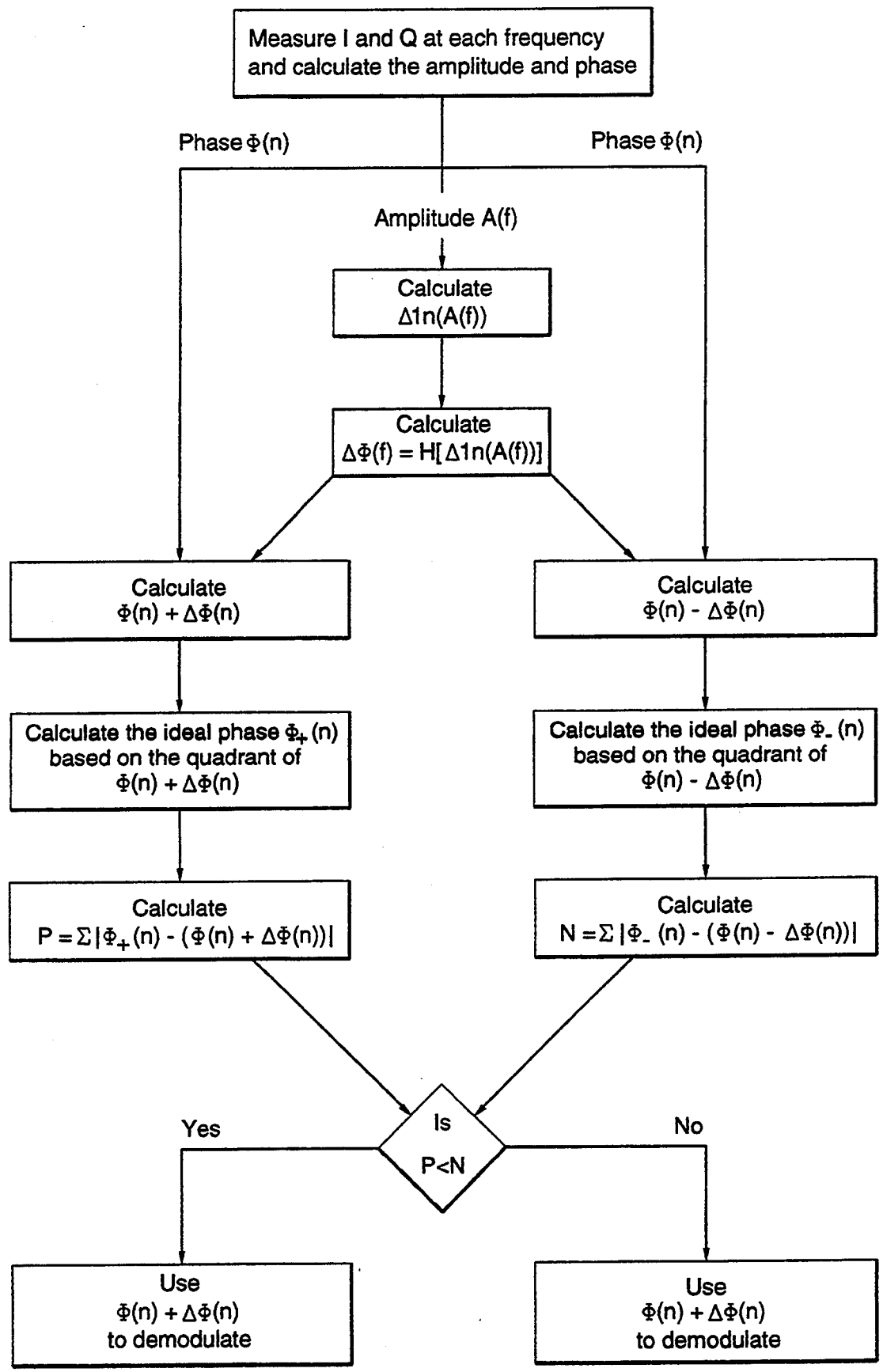
FIG. 3 is a flow diagram of the equalizer shown in FIG. 1 as applied to a Differential Phase Shift Keyed signal.

The estimator can be best understood with reference to FIGS. 2 and 3. In a preferred implementation of the invention, a differential of the logarithm of the amplitude samples is computed. This is preferably carried out in a special purpose computing means according to known principles. Firstly, the square root of the sum of the squares of the inphase and quadrature components is calculated in envelope estimator or computing means 13 to produce a set of amplitude measurements A(n).

In the envelope estimator 13, the envelope A(n) is calculated according to $A(n) = \sqrt{(I^2(n) + Q^2(n))}$ if the information is in the time domain or $A(n) = \sqrt{(I_f^2(n) + Q_f^2(n))}$ where the $I_f$ and $Q_f$ data record is the Fourier transform (frequency transform) of the I and Q data record if the information is in the frequency domain.

Next, the preceding sample $A(n-1)$ is subtracted from the current one, $A(n)$, and the difference thus obtained is divided by the current sample to produce a differential of the logarithm of the amplitude samples. This may be written as $(A(n) - A(n-1))/A(n)$, or as $\Delta ln(A(t))$ or as $\Delta ln(A(f))$ depending on whether the information is in the time or the frequency domain, and produces a data record containing a finite sequence of points. Computing means 13 and 16, such as digital signal processors, to carry out such calculations are well known and include any PC compatible computer programmed to carry out the computation (as for example with the program forming a part of this patent disclosure).

Next the Hilbert transform of the data record is computed in computing means 18, again preferably with a special purpose computing means, though it could be a PC computer programmed to carry out a Hilbert transform (as for example with the program forming a part of this patent disclosure). The computing means 16 and 18 may share components. Taking the Hilbert transform is a way of estimating the phase differential of the envelope samples according to the equation established by Voelcker ("Toward a Unified Theory of Modulation—part 1; amplitude and phase relationships", Proc. IEEE, 1966, 54, 340–353) namely:

$$\Delta\phi(t) = H[\Delta ln(A(t))]$$

or equivalently in the frequency domain using $$\Delta\phi(f) = H[\Delta ln(A(f))].$$

$\Delta 100$ (t) is the differential of the phase of the time signal and $\Delta\phi(f)$ is the phase of frequency transform of the frequency domain signal and each may be estimated by the Hilbert transform of the differential of the logarithm of the amplitude of the samples of the received signal, namely $H[\Delta ln(A(t))]$ for the time domain signal, and $H[\Delta ln(A(f))]$ for the frequency domain signal.

The Hilbert transform is preferably carried out by taking the discrete Fourier transform of the data record, preferably 159 symbols that do not contain more than one signal fade, multiplying the positive frequency spectrum of the transform by "$-i$" (square root $-1$), and the negative frequency spectrum of the transform by "$+i$", and taking the inverse discrete Fourier transform. The result is a set of symbols representing an estimate of the phase differential of the received signal, as determined from its sampled amplitude envelope.

The estimate so calculated does not provide the sign of the differential. This may be determined by known techniques, for example by adding the phase differential to and subtracting the phase differential from the received phase ($\tan^{-1}$ (Q/I)) and taking the sign to be positive if the addition results in the smaller Euclidean distance to the expected value and negative if the subtraction results in the smaller Euclidean distance to the expected value.

For simplicity of the estimator, the determination of the sign need only be carried out for phase differentials greater than a predetermined threshold. This will be in the vicinity of a fade and may be accomplished by segmenting the data record into a segment in which the phase differential is larger than a selected threshold and setting the remainder of the data record to zero. This computation may be carried out with a simple discrimination circuit or equivalent computing means 20 in the estimator.

If more than one fade is contained in the data record, the operation of the invention will become more complex and less accurate since it needs to determine the sign of more than one phase differential segment per data record. Therefore, the data record should be selected to contain no more than one fade.

In the case of the received signal being a $\pi/4$ DQPSK signal where the information in the signal is carried in the phase differential of consecutive time instants, following the recommended North American digital signalling standard, the data record on which the Hilbert transform operates is preferably a transmitted frame encoded on the different carriers. With a symbol rate of 24.3 kSymbols/s, a TDMA (time division multiple access) frame will last 6.54 ms. If a vehicle's speed is 100 km/hr, then it will travel approximately half a wavelength (of 950 MHz waves) each frame and it will not be expected that there will be more than one fade per frame. Hence, this suggests that a TDMA frame is an appropriate data record.

The operation of the invention as applied to an orthogonal quadrature phase shift keyed signal (OFDM) is illustrated in FIG. 3. Thus, the received OFDM signal is first sampled to produce a finite data record containing inphase I and quadrature Q components A differential $\Delta ln A(f)$ is then calculated for all data points in the data record, where $A(f) = \sqrt{(I_f^2 + Q_f^2)}$ where the $I_f$ and $Q_f$ data record is the Fourier transform of the I and Q data record. The Hilbert transform of the differential is then calculated from:

$$\Delta\phi(f) = H[\Delta ln(A(f))].$$

$\phi(f)$ is then calculated from $\tan^{-1}$ (Q/I) and the calculated differential added to and subtracted from it. These values are then compared to the expected value and the closer value is taken to be the true differential.

Equivalently, for each sample n, the ideal phase closest to $\phi(n) + \Delta\phi(n)$ is determined and labelled $\phi_+(n)$, and the ideal phase closest to $\phi(n) - \Delta\phi(n)$ is determined and labelled $\phi_-(n)$. The two sums $P = \Sigma|\phi_+(n) - \{\phi(n) + \Delta\phi(n)\}|$ and $N = \Sigma|\phi_-(n) - \{\phi(n) - \Delta\phi(n)\}|$ are calculated. If $P < N$, then $\phi(n) + \Delta\phi(n)$ is used to correct the signal, and if not then $\phi(n) - \Delta\phi(n)$ is used to correct the signal.

Before application of the Hilbert transform, the Fourier transform of a finite length of the inphase and quadrature components is taken to produce a frequency transform of the carrier signal, and the Hilbert transform operates on the frequency transform. Fourier transforms and apparatus for implementing them are well known in the art and need not be described further here.

If a data record on which a Fourier transform is to operate contains $2^n$ data points, then the Fourier transform applied may be a Fast Fourier Transform.

The estimator thus described estimates the phase differential which will be output from the estimator as a digital signal to the decoder or demodulator 22. The decoder 22 modifies the electromagnetic signal from the sampler 12 with the estimated phase differential. At the decoder 22, the phase differential $\Delta\phi$ will be added to or subtracted from the phase ($\tan^{-1}$ (Q/I)) of the received signal for each sample as determined by the sign of the phase differential to produce a corrected signal.

Figure 4A:
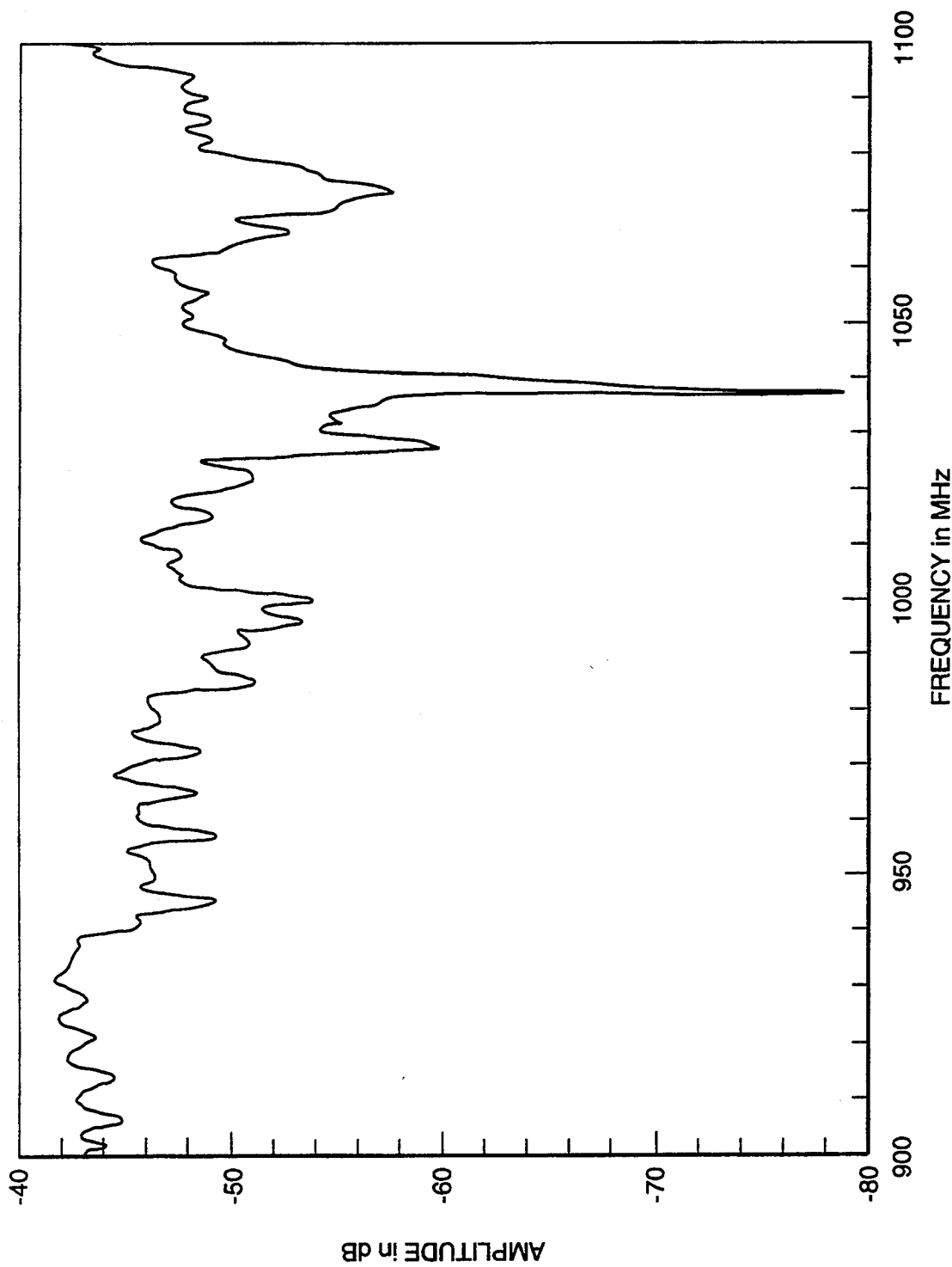
FIG. 4a is a graph showing an actual amplitude of the frequency response of an indoor channel.
Figure 4B:
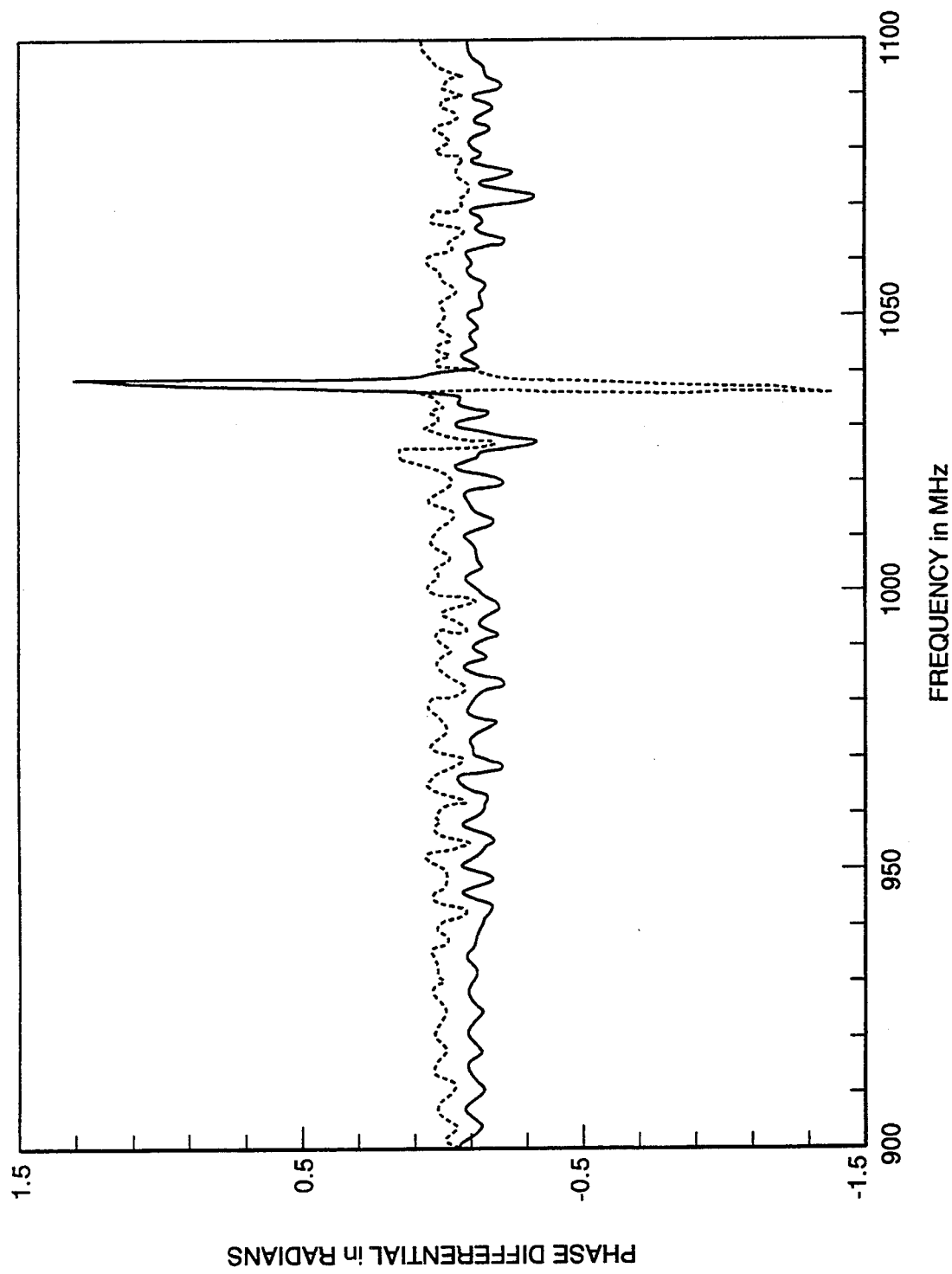

FIG. 4a is a graph showing the amplitude of the frequency response of an indoor channel. FIG. 4b shows the estimated phase differential (hatched line) for the envelope shown in FIG. 4a. The estimated phase differential was estimated through the method of the invention using a simulated apparatus according to the invention. The simulation was carried out using a portion of the program that is attached to this patent disclosure as a schedule. The estimation was made using the equation:

$$\Delta\phi(f) = H[\Delta ln(A(f))].$$

Figure 5:
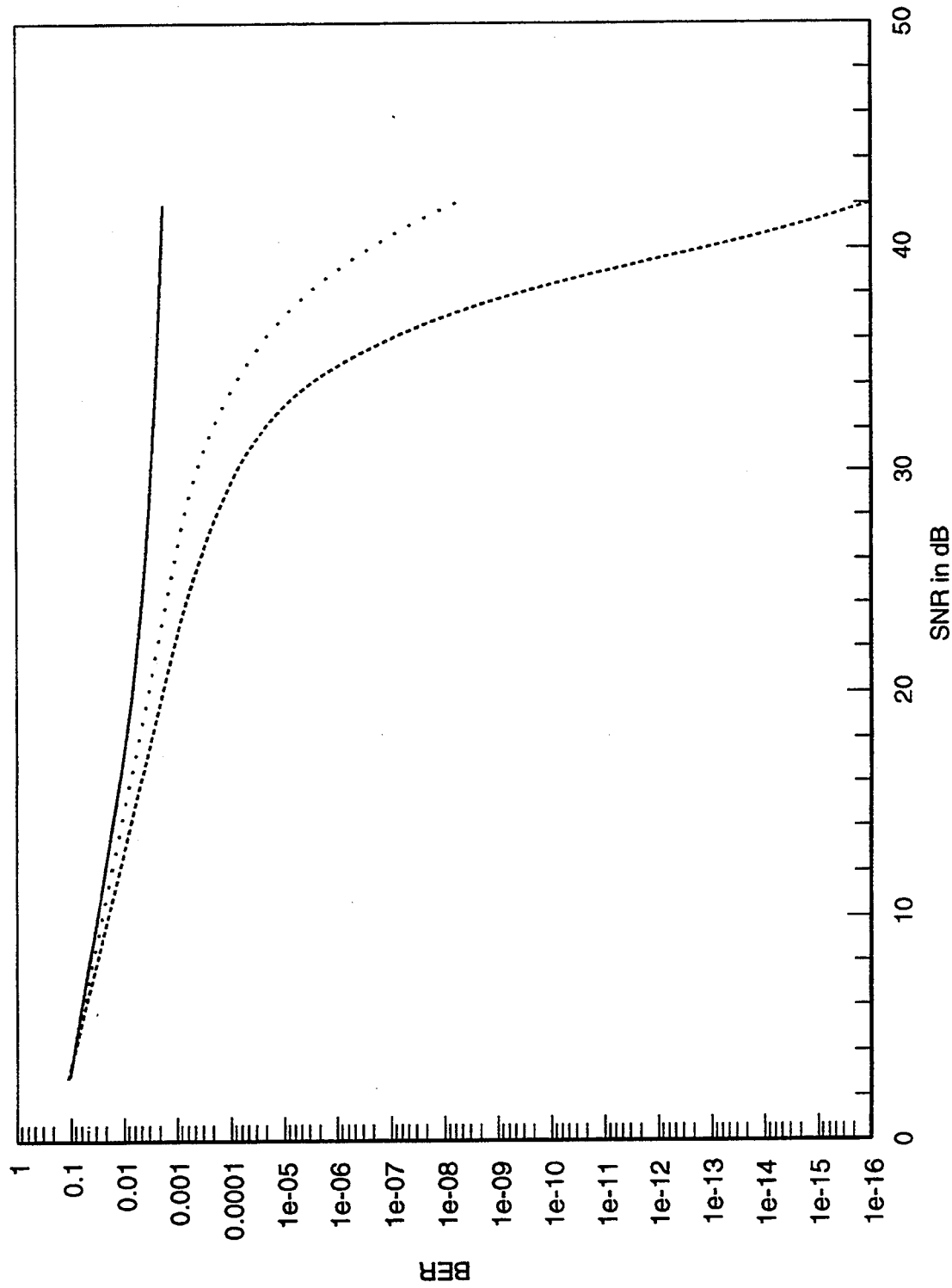
FIG. 5 is a graph showing the bit error rate for the estimation shown in FIG. 4b.

FIG. 4b also shows the true phase differential (solid line). FIG. 5 shows the calculated bit error rate for the unprocessed signal (solid line), the equalizer described in this patent disclosure (dotted line) and an ideal equalizer (hatched line). The bit error rate was calculated from standard procedures, as for example the method described in Pawula et al, "Distribution of the phase angle between two vectors perturbed by Gaussian noise", IEEE Trans. Comm., Vol. COM-30, pp. 1828-1841, August 1982.

ALTERNATIVES EMBODIMENTS

A person skilled in the art could make immaterial modifications to the invention described and claimed in this patent without departing from the essence of the invention.

For example, the method and apparatus described above calculated the phase differential of the received signal. This could have been a different characteristic of the phase of the signal, such as the phase itself, which could be obtained by integrating the differential.

Also, the Hilbert transform was applied to a differential of the logarithm of the amplitude of the received signal, while it is conceivable that the method may also be applied by using other functions of the amplitude.

Instead of a Hilbert transform, a different estimation may be made to estimate the phase differential. In this case, firstly, after the electromagnetic signal has been sampled, a series of data frames of a number of consecutive amplitude samples (A(t)) of the electromagnetic signal are constructed. These data frames are then segmented into segments $[t_1, t_2]$, where the amplitude of the electromagnetic signal is at least a predetermined number of dB less than its running mean, for example, 10 dB. The following calculation is then applied to these segments of the amplitude samples:

$$\Delta\phi(t) \approx 1/t_0 \frac{-1}{1 + (t'/t_0)^2}$$

where $t'=t-t_{min}$, $t_{min}$ is the time in $[t_1, t_2]$ when A(t) reaches its minimum, t is the time from the beginning of the segment, and $t_0$ is the time from the instant the amplitude of the electromagnetic signal reaches its minimum during the segment until the amplitude reaches double its minimum during the segment. In other words, the phase differential may be calculated from $$\Delta\phi(t) \approx -t_0/(t_0^2 + t'^2).$$

It will be appreciated that other estimates of the Hilbert transform will accomplish the same result. Such calculations may be carried out in special purpose digital signal processors or in a PC using software designed for the purpose, as with the software that is appended to this patent disclosure. The resulting estimate of the phase differential may then be added to or subtracted from the received signal samples in the decoder 22.

The phase estimation of the invention may be used in other applications. Thus the resulting phase estimate may be used for example for bit error rate estimation, in which case it will not be necessary to add the final step of and apparatus for correcting the received signal, but the phase estimation will be used in computing means for bit error estimation.

TITLE: DEMODULATION OF A SIGNAL TRANSMITTED OVER A FADING CHANNEL USING PHASE ESTIMATION, METHOD AND APPARATUS THEREFOR

APPENDIX-A

SOFTWARE FOR SIMULATION ON DSP32C

The following software program was developed and run using D3SIM of AT&T. It simulates the operation of the equalizer on a DSP32C.

```
#include <math.h>
#include <stdio.h>
#include <libap.h>

/*********************************************************************** main program

***********************************************************************/
double twopi=6.283185372;
/* List the original transmitted symbols */
int jj2[514] ={ -1 , -1,
     1 ,  1,
     1 , -1,
     1 , -1,
     1 , -1,
    -1 , -1,
```

-1 , 1,
1 , 1,
-1 , 1,
1 , -1,
-1 , -1,
1 , 1,
-1 , -1,
-1 , -1,
-1 , 1,
-1 , -1,
-1 , 1,
-1 , -1,
1 , 1,
-1 , -1,
1 , -1,
-1 , -1,
1 , -1,
1 , -1,
-1 , 1,
-1 , 1,
1 , -1,
1 , -1,
-1 , -1,
1 , -1,
-1 , -1,
-1 , -1,
-1 , 1,
-1 , -1,
-1 , 1,
-1 , -1,
1 , -1,
-1 , 1,
-1 , 1,
-1 , 1,
1 , -1,
1 , 1,
-1 , -1,
-1 , 1,
1 , -1,
1 , 1,
1 , 1,
-1 , 1,
1 , -1,
-1 , -1,
1 , -1,
-1 , 1,
-1 , -1,
1 , 1,
1 , -1,
-1 , 1,
1 , 1,
-1 , -1,
-1 , -1,
-1 , 1,
1 , -1,
1 , -1,
-1 , 1,

```
 1 , -1,
-1 , -1,
-1 ,  1,
-1 , -1,
 1 , -1,
-1 , -1,
 1 ,  1,
-1 , -1,
 1 , -1,
 1 , -1,
-1 , -1,
-1 , -1,
-1 , -1,
-1 ,  1,
 1 , -1,
-1 , -1,
 1 ,  1,
-1 , -1,
-1 , -1,
-1 ,  1,
 1 ,  1,
 1 , -1,
-1 , -1,
-1 , -1,
 1 , -1,
 1 , -1,
 1 ,  1,
-1 , -1,
 1 , -1,
-1 ,  1,
-1 , -1,
 1 , -1,
-1 , -1,
 1 , -1,
 1 ,  1,
 1 , -1,
-1 ,  1,
-1 ,  1,
 1 ,  1,
-1 , -1,
-1 , -1,
-1 , -1,
 1 , -1,
 1 ,  1,
 1 ,  1,
 1 ,  1,
-1 ,  1,
 1 ,  1,
 1 ,  1,
 1 ,  1,
-1 , -1,
-1 , -1,
 1 , -1,
 1 ,  1,
 1 , -1,
-1 , -1,
 1 , -1,
```

1 , 1,
1 , -1,
1 , -1,
-1 , -1,
-1 , 1,
1 , 1,
-1 , 1,
1 , -1,
-1 , 1,
1 , 1,
-1 , -1,
1 , 1,
1 , 1,
-1 , -1,
-1 , 1,
1 , -1,
-1 , -1,
1 , 1,
-1 , -1,
1 , 1,
1 , -1,
1 , -1,
1 , -1,
-1 , -1,
1 , 1,
1 , -1,
-1 , 1,
1 , 1,
1 , -1,
1 , -1,
-1 , 1,
-1 , 1,
1 , -1,
-1 , 1,
1 , -1,
-1 , -1,
-1 , -1,
-1 , 1,
-1 , 1,
-1 , -1,
-1 , -1,
-1 , 1,
-1 , 1,
-1 , 1,
-1 , -1,
-1 , -1,
1 , 1,
1 , -1,
1 , -1,
1 , 1,
-1 , 1,
-1 , 1,
-1 , -1,
1 , 1,
-1 , -1,
1 , -1,

1 , 1,
1 , 1,
-1 , 1,
1 , 1,
-1 , 1,
-1 , -1,
-1 , -1,
-1 , -1,
1 , -1,
-1 , 1,
1 , 1,
-1 , -1,
1 , 1,
1 , -1,
-1 , 1,
1 , -1,
-1 , -1,
1 , 1,
1 , -1,
-1 , -1,
1 , 1,
-1 , 1,
-1 , 1,
1 , -1,
1 , 1,
1 , 1,
1 , -1,
-1 , -1,
1 , -1,
-1 , -1,
1 , 1,
1 , -1,
-1 , -1,
-1 , -1,
-1 , 1,
-1 , 1,
1 , 1,
1 , 1,
-1 , 1,
1 , -1,
-1 , -1,
-1 , 1,
1 , -1,
1 , -1,
1 , -1,
1 , -1,
1 , 1,
-1 , 1,
-1 , 1,
-1 , -1,
-1 , 1,
-1 , -1,
-1 , -1,
1 , -1,
1 , -1,
1 , -1,
1 , -1,
1 , -1,

```
    1 ,  1,
   -1 , -1,
   -1 ,  1,
   -1 ,  1,
    1 ,  1,
   -1 ,  1,
   -1 , -1,
    1 , -1,
    1 , -1,
    1 ,  1,
    1 , -1,
   -1 , -1,
    1 ,  1,
   -1 , -1,
    1 ,  1,
    1 , -1,
    1 ,  1,
    1 , -1,
   -1 , -1,
    1 , -1,
   -1 , -1,
   -1 ,  1,
    1 ,  1
};
/* List the received I and Q */
double z[514]={
  1.8826647996902  , 0.57904273271561,
 -0.98167502880096 ,-1.71514880657720,
 -1.92218518257714 ,-0.45452463626862,
 -1.63705182075500 , 1.08983910083770,
 -0.31615784764290 , 1.92487037181850,
 -1.52353370189670 , 1.18062043190000,
  0.16620002686977 ,-1.88997232913970,
 -1.37612247467040 , 1.25216436386110,
  7.16810580343010E-03 ,-1.81778168678280,
 -1.30318343639370 ,-1.19725465774540,
 -0.15820230543613 ,-1.70962727069850,
 -0.99022841453552 , 1.33297872543330,
 -1.56784284114840 , 0.32700437307358,
 -1.34143733978270 ,-0.75913363695145,
  1.39570045471190 ,-0.49621558189392,
  1.32901597023010 , 0.50875544548035,
 -1.19731390476230 , 0.66275292634964,
 -1.29670631885530 ,-0.24445547163486,
  0.82353335618973 , 0.97751879692078,
  2.79662609100340E-02 , 1.24598097801210,
  0.97553628683090 , 0.74172759056091,
  0.30242365598679 , 1.17873072624210,
  1.11586451530460 , 0.49576562643051,
  1.09718608856200 ,-0.57270908355713,
 -0.24569725990295 , 1.24180626869200,
 -0.83266228437424 ,-1.00383615493770,
 -1.35089540481570 , 2.35829083248970E-03,
 -0.90133684873581 , 1.07634282112120,
 -1.44096779823300 , 0.24240809679031,
 -0.79242151975632 , 1.29819822311400,
 -1.51021182537080 , 0.46876969933510,
```

-1.4932200908661 , -0.67981052398682,
1.5572143793106 , -0.67623662948608,
1.6570891141891 , 0.56612873077393,
-1.5809999704361 , 0.86023199558258,
-1.7863020896912 , -0.45382413268089,
-1.5810590982437 , 1.0169448852539,
0.34510406851768 , -1.8782730102539,
1.14343416690833 , 1.5573689937592,
-1.9314140081406 , -0.24187317490578,
-1.5104018449783 , 1.2377147674561,
1.9451805353165 , 0.14569547772408,
1.2988004684448 , 1.4411246776581,
-1.9200929403305 , -5.7761263102293E-02,
-1.3509848117828 , 1.3267296552658,
1.8577233552933 , -2.1126555278897E-02,
-1.3225439786911 , -1.2418869733810,
1.7606525421143 , -9.0550981462002E-02,
1.11615555051804 , -1.2882466316223,
1.6323974132538 , -0.15046791732311,
0.97648859024048 , -1.2267235517502,
0.20117856562138 , 1.4773093461990,
-0.82589977979660 , 1.1416391134262,
1.3004480600357 , -0.24329216778278,
0.66765332221985 , -1.0373107194901,
0.27767503261566 , 1.1074353456497,
0.50518971681595 , -0.91855829954147,
0.90428864955902 , -0.30539751052856,
0.79054325819016 , 0.34204551577568,
-0.69724625349045 , 0.32767096161842,
-0.18177013099194 , 0.65859514474869,
0.34578496217728 , 0.49258133769035,
-0.52803617715836 , -2.78416797751873E-02,
-0.29641786217690 , 0.36104345321655,
-0.40400594472885 , 0.11642142385244,
0.11455089598894 , -0.37470200657845,
0.29129487276077 , -0.24794004857540,
-4.7727126628160E-02 , -0.38791200518608,
0.19418933987617 , -0.36395436525345,
-0.40166890621185 , 0.18578046560287,
-0.46209335327148 , -0.116335131227797,
-0.41677090525627 , 0.29576727747917,
-6.0622435063124E-02 , 0.54043716192245,
-0.43378528952599 , 0.37475159764290,
-0.59756731987000 , -2.9096489772201E-02,
-0.42078813910484 , -0.45302680134773,
0.63260388374329 , 2.2896632552147E-02,
0.47454643249512 , -0.43297693133354,
0.64523047208786 , 4.2224980890751E-02,
-0.41148558259010 , -0.49813264608383,
8.6346767842770E-02 , -0.63570129871368,
0.52332174777985 , -0.35753899812698,
-0.15361997485161 , 0.60483527183533,
0.54942035675049 , -0.27337777614594,
0.24155624210835 , -0.55399334430695,
0.57553601264954 , -0.16218262910843,
0.48504012823105 , 0.34690761566162,
0.60061538219452 , -2.7974145486951E-02, 0.46577885746956 , -0.40029266476631,
-0.62349128723145 , -0.12451778352261,
-0.30245357751846 , -0.59375917911530,
-0.64292871952057 , -0.29000273346901,
0.72607111930847 , -0.19453555345535,
0.65767973661423 , 0.46279823780060,
0.85773074626923 , -7.97744774610996E-02,
0.66653263568878 , 0.63700795173645,
0.98371291160583 , 3.84463655859232E-02,
-0.66836547851562 , -0.80670833587646,
-1.09911823272710 , -0.15678122639656,
0.96613508462906 , -0.66218781471252,
-0.27184593677521 , 1.19933533668520,
1.10986292362210 , -0.64718896150589,
1.28019189834590 , 0.38049080967903,
0.62276816368103 , 1.23297810554500,
-0.47980448603630 , 1.33809399604800,
0.58856463432312 , 1.33123123645780,
0.56721973419189 , -1.37014126777650,
-1.40116989612580 , 0.54447442293167,
1.37422728538510 , 0.64058619737625,
-1.44024920463560 , 0.49066120386124,
1.34910464286800 , 0.69823592901230,
-0.42755731940269 , -1.44690823554990,
-0.73903095722198 , 1.29443109035490,
-1.42062079906460 , 0.35585281252861,
-1.21078121662140 , -0.76239341497421,
-1.36191153526310 , 0.27647992968559,
1.09963226318360 , 0.76832592487335,
1.27233743667600 , -0.19058661162853,
0.96331912279129 , 0.75740247964859,
1.15443992614750 , -9.9505998194218E-02,
-0.80496501922607 , -0.73074960708618,
-1.01166462898250 , 4.71803499385710E-03,
-0.69000792503357 , 0.62838578224182,
-0.84825158119202 , -9.2191144824028E-02,
0.63727533817291 , -0.43797433376312,
-0.66910350322723 , -0.18957243859768,
0.57503563165665 , -0.23856720328331,
0.28575962781906 , -0.47963011264801,
3.52981239557270E-02 , 0.50607603788376,
0.37911093235016 , -0.28557923436165,
0.43339198827744 , 0.16655600070953,
-9.2856124043465E-02 , -0.46805140376091,
-0.36173328757286 , 0.36008602380753,
-0.55111116170883 , -9.2662073671818E-02,
0.54514288902283 , -0.28926151990891,
0.26530939340591 , -0.62695705890656,
0.71201461553574 , -0.22391571104527,
-0.69442093372345 , -0.41981008648872,
-0.16683530807495 , -0.85803741216660,
-0.55144131183624 , 0.75251996517181,
0.12049946933985 , 0.97948336601257,
0.80047225952148 , 0.65618216991425,
1.07331049442290 , -8.6988314986229E-02,
0.83770149946213 , 0.73083782196045,

-6.7907817661762E-02 , -1.1372458934784,
-0.86384069919586 , -0.77313911914825,
 1.1698449850082 , -6.4328491687775E-02,
-0.87872487306595 , -0.781810760049805,
-1.17052125930790 , 7.6740458607674E-02,
-0.75661289691925 , 0.88237941265106,
-0.10502639412880 , -1.1395549774170,
 0.87500441074371 , 0.69834393262863,
 1.0780709981918 , -0.14845751225948,
-0.60881644487381 , 0.85695564746857,
 0.20570844411850 , 0.98799550533295,
-0.49079838395119 , 0.82871961593628,
-0.87198609113693 , 0.27489036321640,
 0.34792473912239 , -0.79089194536209,
 0.35360851883888 , 0.73334228992462,
-0.18458327651024 , 0.74415004253387,
-0.57590019702911 , 0.43903124332428,
 5.7776970788836E-03 , -0.68923103809357,
 0.52798008918762 , 0.40390974283218,
-0.62690776586533 , 0.18303082883358,
 0.22190481424332 , -0.61702972650528,
 0.55797028541565 , -0.37609174847603,
 0.70261883735657 , 3.4565746784210E-02,
-0.56754517555237 , -0.48320794105530,
-0.78116804361343 , 0.15341848134995,
-0.40339776873589 , 0.75160259008408,
 0.84919923543930 , -0.33748552203178,
-0.31929352879524 , 0.92272567749023,
-0.51332873106003 , -0.90345317125320,
 0.23162299394608 , -1.0757941007614,
-0.94100481271744 , 0.67701315879822,
-1.2062630653381 , -0.14108607172966,
-0.95936530828476 , 0.82507961988449,
 1.3102972507477 , 4.8358015716076E-02,
-0.95462840795517 , -0.95657634735107,
 1.3848868608475 , -4.5906782150269E-02,
-1.0633902549744 , -0.93128252029419,
 1.4279329776764 , -0.14106513559818,
 1.1497660875320 , 0.88279163837433,
 0.23647691309452 , 1.4383053779602,
-0.81110906600952 , 1.2128539085388,
 0.33149531483650 , 1.4158697128296,
-1.2524482011795 , -0.71695524454117,
 0.42545720934868 , 1.3614822626114,
-0.60175400972366 , 1.26901996135710,
 1.2769542932510 , -0.51767551898956,
 0.46760299801826 , -1.2636756896973,
 0.60743457078934 , 1.16498517990110,
 1.2380973100662 , 0.31721931695938,
 0.69398546218872 , 1.02907121181490,
 0.15386630594730 , -1.1944670677185,
-0.77655005455017 , -0.87338465452194,
-1.8741229549050E-02 , -1.1353790760040,
-0.70263749361038 , 0.85432267189026,
-0.19654582440853 , -1.0637385845184,
 0.92648190259933 , 0.52192509174347,
 0.98265725374222 , -0.37526836991310,

```
    -0.99220246076584 , -0.33656212687492,
     0.55053806304932 ,  0.89534473419189,
     1.05506724119186 ,  0.151191125869751,
     0.71802806854248 ,  0.80500024557114,
     1.10111143922806 , -2.6790169999003E-02,
     0.87359136343002 ,  0.71470791101456,
    -0.194592565299808, -1.1428083181381,
    -1.01338911056552 , -0.62734061479568,
    -0.34699076414108 , -1.1751155853271,
     0.54547435045242 , -1.1340159177780,
     0.48006322979927 ,  1.19750690460221,
    -1.2326081991196  , -0.47131305932999,
     0.59059274196625 ,  1.2095856666565,
     0.40663030743599 , -1.30693876743322,
     0.67615872621536 ,  1.21111126184464,
     1.3554904460907  ,  0.35272744297981,
     0.73520946502686 ,  1.2020268440247,
    -1.3775087594986  , -0.31040790677071,
    -1.1824613809586  ,  0.76710045337677,
    -0.27996954321861 ,  1.3730301856995,
     0.77210420370102 ,  1.1527576446533,
     1.3428838253021  ,  0.26121476292610,
    -0.75139236450195 , -1.1134694814682,
     1.2886705398560  ,  0.25347581505775,
    -1.0653619766235  ,  0.70698553323746,
    -1.2127152681351  , -0.25565749406815,
     1.0094038248062  , -0.64167791604996,
     1.1179939508438  ,  0.26628923416138,
     0.94675332307816 , -0.55893445014954,
     0.28359553217888 , -1.0080425739288,
    -0.46277087926865 , -0.87873333692551,
    -0.88684558868408 , -0.30556473135948,
    -0.80680304765701 ,  0.35761266946793,
     0.75870722532272 ,  0.33003318309784,
     0.24814304709435 ,  0.73252141475677,
    -0.62811541557312 , -0.35476726293564,
     0.65750586986542 , -0.13914376497269,
    -0.49959596991539 , -0.37754675745964,
     0.58338809013367 , -3.5333048552275E-02,
     0.37756574153900 ,  0.39624589681625,
     0.51176452636719 ,  5.8793801814318E-02,
     0.40890917181969 , -0.26618802547455,
    -0.44414889812469 , -0.13911458849907,
    -0.41381889581680 ,  0.16923630237579,
    -0.38192304968834 , -0.20201873779297,
     8.9968837797642E-02, 0.40955415368080,
    -0.24452674388885 ,  0.32629245519638,
     0.39503705501556 , -3.1020458787680E-02,
     0.26439002156258 , -0.27824369072914,
    -0.36956810951233 , -5.6873057037592E-03,
    -0.26016449928284 ,  0.23851068317890,
    -0.33284601569176 , -1.9010026007891E-02,
    -0.23125946521759 ,  0.20754601061344,
    -0.28497639298439 , -8.6228372529149E-03,
     0.17795602977276 , -0.18550240993500,
    -0.22646434605122 ,  2.4967700242996E-02};
double fr1[514];
```

```
/*******************************************************************/
main()
{
int    errorre=0,errorim=0,number,mf,init,m,id[257],s[257],i,j,k;
int    jre,jim,l;
double metricp,metricm,mini1,mini2,jey;
double deltphas, xre, xim, curphas[129];

asm(".global declared");
asm ("declared:");

number = 128;

/*********** read the I & Q components & find their amplitude. "fr1" ********/ for (j=0; j <= number; j++){
        curphas[j] = atan2(z[2*j+1],z[2*j]);
        fr1[2*j] = sqrt(z[2*j]*z[2*j]+z[2*j+1]*z[2*j+1]);} asm(".global read_data");
asm ("read_data:");

/********* Estimate the Group delay "fr1" from the amplitude "fr1" *********/ for (k=1; k <= number ;k++){
          fr1[2*k-1] = (fr1[2*k] - fr1[2*k-2])/fr1[2*k];
          fr1[2*k-2] =0.0;}
        fr1[2*k] = 0.0;

/********* estimate the group delay "fr1" using the hilbert transform *********/ m = 7;

asm(".global b_fft");
asm ("b_fft:");
        fft(number,m,fr1);
asm(".global a_fft");
asm ("a_fft:");

for(k=1; k<= number/2; k++){
          jey = fr1[2*k-1]/number;
          fr1[2*k-1] = 0.0-fr1[2*k]/number;
          fr1[2*k]=jey;} for (k=number/2+1; k <= number; k++) { jey = fr1[2*k-1]/number;
          fr1[2*k-1]= fr1[2*k]/number;
          fr1[2*k] = 0-jey;} asm(".global b_ifft");
asm("b_ifft:");
        ifft(number,m,fr1);
asm(".global a_ifft");
asm("a_ifft:");
```

/********************* Thresholding & segmenting *******************/

The purpose of this section is to determine the segments of the received frequency frame where the estimated group delay is larger than a certain threshold. These segments are labelled

****/

```
        id[1]=1;
        m = 0;
        init = 0;
        for (k=1; k<=number; k++){
           if(( fr1[2*k-1] > 0.07 )||( fr1[2*k-1] < -0.07)){
              fr1[k] = fr1[2*k-1];
              if(init==0){
                 m++;
                 id[m] = k;
                 init = 1;}}
           else {
              fr1[k] = 0.;
              if(init==1) {
                    m++;
                    id[m] = k;
                    init = 0;}}
        }
          if(init==1){
             m++;
             id[m] = number + 1;}
``` asm(".global threshold");
asm("threshold:");

/**********************Group delay Sign Algorithm*******************

The purpose of this part of the software is to determine the proper sign of estimated group delay. This is done through defining two Hamming distances one if we assuem the estaimted group delay was positive and the other if it is assumed negative and choosing the sign that leads to the smaller distance

****************************************************************/

```
        for (k=1; k<=m; k++){
           metricp = 0.;
           metricm = 0.;
           if( (id[k]==id[k+1]-1) || (id[k]==id[k+1]-2) ){
              s[k]=0;
              goto twenty;} for (j =id[k]+1; j<=id[k+1]-1; j++){ deltphas = curphas[j] - curphas[j-1] - fr1[j];

xre = 1.4142136377*cos(deltphas);
                 xim = 1.4142136377*sin(deltphas);

mini1 = 1.-xre;
                 mini1 = mini1*mini1;
```

```
        if(mini1>((1.+xre)*(1.+xre))) mini1=(1.+xre)*(1.+xre);
            mini2 = 1.-xim;
            mini2 = mini2*mini2;
        if(mini2>((1.+xim)*(1.+xim))) mini2=(1.+xim)*(1.+xim);

metricp += mini1 + mini2;

/*****************************************************************/ deltphas = curphas[j] - curphas[j-1] + fr1[j];

xre = 1.4142136377*cos(deltphas);
        xim = 1.4142136377*sin(deltphas);

mini1 = 1.-xre;
            mini1 = mini1 * mini1;
        if(mini1>((1.+xre)*(1.+xre))) mini1=(1.+xre)*(1.+xre);
            mini2 = 1.-xim;
    mini2 = mini2 * mini2;
        if(mini2>((1.+xim)*(1.+xim))) mini2=(1.+xim)*(1.+xim);

metricm +=  mini1 + mini2;

}
        s[k]=0-1;
        if(metricp < metricm) s[k]=1;
/*      printf("s[%d] = %d\n",k,s[k]);*/
twenty: k++;}

/*****************************************************************/ for (k=1; k<=m; k++){
        for (j =id[k]; j<=id[k+1]-1; j++) fr1[j] *= s[k];
/*k++;*/        }
asm(".global a_fs");
asm("a_fs:");

/********************* Decode the Signal **********************/ l = 1;
        while (l < number+1){ deltphas = curphas[l] - curphas[l-1] - fr1[l];

xre = cos(deltphas);
            xim = sin(deltphas);

jre = xre/fabs(xre);
    jim = xim/fabs(xim);
    if (jre == jim) {jre = 0 -jre;
            jim = 0 -jim;} if(l>1){
                if(jre != jj2[2*l]) errorre++;
```

```
        if(jim != jj2[2*l+1]) errorim++;
    }        l++;
}
printf("%d %d %d\n",i,errorre,errorim);

asm(".global end");
asm("end:");
}                /*end of main*/
```

We claim:

1. A method of processing an electromagnetic signal transmitted over a fading channel, in which information in the signal is carried by a phase differential of a number of frequency components of the electromagnetic signal, the method comprising the steps of:
   sampling of the signal with a sampler to produce amplitude samples of the signal;
   constructing data frames of a number of consecutive amplitude samples of the electromagnetic signal;
   selecting segments of the data frames where the amplitude of the electromagnetic signal is below a predetermined threshold below a running mean of the amplitude samples;
   for each segment, estimating a phase differential $\Delta\phi(f)$ in an estimator from $$\Delta\phi(f) = -f_0/(f_0^2 + f'^2)$$

where $f' = f - f_{min}$, f is the frequency from the beginning of the segment, $f_{min}$ is the frequency in the segment when the absolute value of the signal reaches its minimum, and $f_0$ is the frequency from when the amplitude of the electromagnetic signal reaches its minimum during the segment until the amplitude reaches double its minimum during the segment;
   determining the sign of the estimated phase differential; and
   modifying the electromagnetic signal by adding or subtracting the estimated phase differential from the phase of the electromagnetic signal depending on the determination of the sign of the estimated phase differential to produce a corrected electromagnetic signal.

2. A method of processing a signal transmitted over a fading channel, the information in the signal being carried by the phase $\phi(n)$ of a number of consecutive time instants of the signal, the method comprising the steps of:
   sampling the signal with a sampler to produce amplitude samples of the signal;
   computing a function of the amplitude of the signal to produce a data record corresponding to the function;
   computing a Hilbert transform of the data record to produce a signal corresponding to an estimated phase differential of the data record;
   determining the sign of the estimated phase differential ($\Delta\phi(n)$) of the data record by:
   determining for each sample n, the ideal phase closest to $\phi(n) + \Delta\phi(n)$ and labelling it $\phi_+(n)$;
   determining the ideal phase closest to $\phi(n) - \Delta\phi(n)$ and labelling it $\phi_-(n)$;
   computing $P = \Sigma |\phi_+(n) - \{\phi(n) + \Delta\phi(n)\}|$ and $N = \Sigma |\phi_-(n) - \{\phi(n) - \Delta\phi(n)\}|$ for each element of the data record; and
   demodulating the electromagnetic signal in a demodulator by adding $\Delta\phi(n)$ to the phase $\phi(n)$ if $P < N$, and if not then by subtracting $\Delta\phi(n)$ from the phase $\phi(n)$ to produce a corrected signal.

3. The method of claim 2 in which the function of the amplitude of the signal is a differential of the logarithm of the amplitude of the signal.

4. The method of claim 2 in which the Hilbert transform of the data record is calculated by taking a Fourier transform of the data record to produce data signals corresponding to positive and negative frequency transforms of the data record, multiplying the data signal corresponding to the positive frequency transform by the negative square root of minus one and the data signal corresponding to the negative frequency transform by the positive square root of minus one to produce modified data signals corresponding to the positive and negative frequency transforms respectively, combining the modified data signals into one record and taking an inverse Fourier transform of the record.

5. The method of claim 2 in which the data record includes data points and the sign of the estimated phase differential of the data record is determined only for data points having an estimated phase differential larger than a preselected threshold.

6. The method of claim 2 in which estimating the phase differential includes:
   constructing data frames of a number of consecutive amplitude samples of the signal;
   selecting segments of the data frames where the amplitude of the electromagnetic signal is below a predetermined threshold below a running mean of the amplitude samples;
   for each segment, estimating the phase differential $\Delta\phi(t)$ from $$\Delta\phi(n) \approx -t_0/(t_0^2 + t'^2)$$

where $t' = t - t_{min}$, t is the time from the beginning of the segment, $t_{min}$ is the time in the segment when the absolute value of the signal reaches its minimum, and $t_0$ is the period of time from the instant the amplitude of the signal reaches its minimum during the segment until the amplitude reaches double its minimum during the segment.

7. An apparatus for processing an electromagnetic signal transmitted over a fading channel, in which information in the signal is carried by a phase differential of a number of frequency components of the electromagnetic signal, comprising:
- a sampler for sampling the signal to produce amplitude samples of the signal;
- means for constructing data frames of a number of consecutive amplitude samples of the electromagnetic signal;
- means for selecting segments of the data frames where the amplitude of the electromagnetic signal is below a predetermined threshold below a running means of the amplitude samples;
- means for estimating a phase differential $\Delta\phi(f)$ for each segment in an estimator from $$\Delta\phi(f) = -f_0/(f_0^2 + f'^2)$$

where $f' = f - f_{min}$, f is the frequency from the beginning of the segment, $f_{min}$ is the frequency in the segment when the absolute value of the signal reaches its minimum, and $f_0$ is the frequency from when the amplitude of the electromagnetic signal reaches its minimum during the segment until the amplitude reaches double its minimum during the segment;
- means for determining the sign of the estimated phase differential; and
- means for modifying the electromagnetic signal by adding or subtracting the estimated phase differential from the phase of the electromagnetic signal depending on the determination of the sign of the estimated phase differential to produce a corrected electromagnetic signal.

* * * * *